US012195840B2

(12) United States Patent
Gizzatov et al.

(10) Patent No.: US 12,195,840 B2
(45) Date of Patent: Jan. 14, 2025

(54) METHODS FOR GROWING CRYSTALS ON QCM SENSORS

(71) Applicant: Saudi Arabian Oil Company, Dhahran (SA)

(72) Inventors: Ayrat Gizzatov, Cambridge, MA (US); Mohammed R. Kawelah, Cambridge, MA (US); Martin E. Poitzsch, Cambridge, MA (US); Wei Wang, Cambridge, MA (US); Amr I. Abdel-Fattah, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 277 days.

(21) Appl. No.: 16/989,270

(22) Filed: Aug. 10, 2020

(65) Prior Publication Data

US 2022/0042164 A1 Feb. 10, 2022

(51) Int. Cl.
  *C23C 14/22* (2006.01)
  *C23C 14/02* (2006.01)
  *G01B 15/08* (2006.01)
  *G01N 23/2251* (2018.01)

(52) U.S. Cl.
  CPC .......... *C23C 14/221* (2013.01); *C23C 14/024* (2013.01); *G01B 15/08* (2013.01); *G01N 23/2251* (2013.01); *G01N 2223/07* (2013.01); *G01N 2223/40* (2013.01); *G01N 2223/507* (2013.01)

(58) Field of Classification Search
  CPC .............................. C23C 14/221; C23C 14/024
  See application file for complete search history.

(56) References Cited

U.S. PATENT DOCUMENTS

| 9,182,376 B2 | 11/2015 | Klasner |
| 2018/0337357 A1 | 11/2018 | Matsushima et al. |

FOREIGN PATENT DOCUMENTS

| CN | 105651574 A | 6/2016 |
| CN | 111534572 A | 8/2020 |
| CN | 111537602 A | 8/2020 |

OTHER PUBLICATIONS

Tarasevich, Nucleation and Growth of Calcium Phosphate from Physiological Solutions onto Self-Assembled Templates by a Solution-Formed Nucleus Mechanism, J. Phys. Chem. B, 2003, 107 (38), p. 10367-10377 (Year: 2003).*
Sun, Self-assembled monolayer of 3-mercaptopropionic acid on electrosupn polystyrene membranes for Cu2+ detection, Sensors and Actuators, B 161, 2012, p. 322-328 (Year: 2012).*
Tanahashi, Quantitative assessment of apatite formation via a biomimetic method using quartz crystal microbalance, Journal of Biomedical Materials Research, vol. 31, (1996), p. 243-249 (Year: 1996).*
Cicek, Molecularly Imprinted Quartz Crystal Microbalance Sensor (QCM) for Bilirubin Detection, Chemosensors, 2016, 4, 21, p. 1-13 (Year: 2016).*
Watt, The Behavior of Calcium Phosphate and Calcium Carbonate (Bone Salts) Precipitated in Various Media with Applications to Bone Formation, Biological Bulletin, Jun. 1923, vol. 44 No. 6, p. 280-317 (Year: 1923).*
Toworfe, Nucleation and growth of calcium phosphate on amine-, carboxyl- and hydroxyl-silane self-assembled monolayers, Biomaterilas, 27, 2006, p. 631-642 (Year: 2006).*
Ji, Fly Ash Particles Modified with Various Surface Coupling Densities and Its Thermal Stability Mechanism of Oil-in-Water Emulsion, Proceedings of the International Field Exploration and Development Conference 2017, Springer Series in Geomechanics and Geoengineering, Springer, p. 964 (Year: 2017).*
Wang, Toward Reservoir-on-a-Chip: Fagricating Reservoir Micromodels by in Situ Growing Calcium Carbonate Nanocrystals in Microfluidic Channels, ACS Appl. Mater. Interfaces, 2017, 9, p. 29380-29386 (Year: 2017).*
Oliver, Reusable chromium-coated quartz crystal microbalance for immunosensing, Colloids and Surfaces B: Biointerfaces, 88, 2011, p. 191-195 (Year: 2011).*
Cao et al., "Investigating Calcite Growth Rates Using a Quartz Crystal Microbalance with Dissipation (QCM-D)", http://www.cive.uh.edu/faculty/hu, 2017.
Lioliou et al., "Heterogeneous nucleating and growth of calcium carbonate on calcite and quartz", Journal of Colloid and Intervace Science, vol. 308, pp. 421-428, 2007.
Tang et al., "Research on Growth Behavior of Calcium Carbonate Scale by Electrochemical Quartz Crystal Microbalance", International Journal of Electrochemical Science, vol. 12, p. 11955-11971, 2017.
Tremel et al., "Template Surfaces for the Formation of Calcium Carbonate", Handbook of Biomineralization, pp. 209-232, 2007.
Wang et al., "Toward Reservoir-on-a-Chip: Fabricating Reservoir Micromodels by in Situ Growing Calcium Carbonate Nanocrystals in Microfluidic Channels", American Chemical Society, Applied Materials & Interfaces, vol. 9, p. 29380-29386, 2017.
Wu et al., "Quantitative control of CaCO3 growth on quartz crystal microbalance sensors as a signal amplification method", Royal Society of Chemistry, Analyst, vol. 142, pp. 2547-2551, 2017.

(Continued)

*Primary Examiner* — Tabatha L Penny
(74) *Attorney, Agent, or Firm* — DINSMORE & SHOHL LLP

(57) ABSTRACT

According to one or more embodiments, a method of growing crystals on a QCM sensor may include treating a crystal growth surface of the QCM sensor with a coupling agent, applying a cation stream to the crystal growth surface of the QCM sensor, and applying an anion stream to the crystal growth surface of the QCM sensor. The crystals forming a crystal layer may have an average thickness greater than 5 nanometers. According to one or more embodiments, a QCM sensor may include a crystal layer on a crystal growth surface of the QCM sensor, where the crystal layer is formed by a process including treating the crystal growth surface of the QCM sensor with a coupling agent, applying a cation stream to the crystal growth surface of the QCM sensor, and applying an anion stream to the crystal growth surface of the QCM sensor.

12 Claims, 2 Drawing Sheets

(56) References Cited

OTHER PUBLICATIONS

Yun et al., "Toward Reservoir-on-a-Chip: Rapid Performance Evaluation of Enhanced Oil Recovery Surfactants for Carbonate Reservoirs Using a Calcite-Coqated Micromodel", Scientific Reports, https://www.nature.com/articles/s41598-020-57485-x, 12 pgs., 2020.
International Search Report and Written Opinion dated May 18, 2021 pertaining to International application No. PCT/US2020/065857 filed Dec. 18, 2020, 18 pages.
Tarasevich, B. J. et al. "Nucleation and Growth of Calcium Phosphate from Physiological Solutions onto Self-Assembled Templates by a Solution-Formed Nucleus Mechanism", Journal of Physical Chemistry. B, Materials, Surfaces, Interfaces and Biophysical, Washington, DC, US, vol. 107, No. 38, Sep. 25, 2003, pp. 10367-10377.
Saudi Arabian First Examination Report, dated Jan. 30, 2024, received in corresponding Saudi Arabian Application No. 523442464, pp. 1-10.

* cited by examiner

METHODS FOR GROWING CRYSTALS ON QCM SENSORS

BACKGROUND

Field

The present disclosure relates to the study of formulations and chemicals for reservoir applications. More specifically, the present disclosure relates to the study of formulations and chemicals at the micro/nano level.

Technical Background

Typically, core flood experiments are used to study formulations and chemical for reservoir applications. However, core flood experiments are expensive and time consuming. Additionally, core flood experiments do not provide information at the micro/nano level.

Accordingly, the present inventors have recognized a need for an alternative to core flood experimentation for studying formulations and chemicals at the micro/nano level.

BRIEF SUMMARY

According to the subject matter of the present disclosure, a method of growing crystals on a quartz crystal microbalance (QCM) sensor comprises treating a crystal growth surface of the QCM sensor with a coupling agent comprising carboxylic acid functional groups to bond the carboxylic acid functional groups of the coupling agent to the crystal growth surface of the QCM sensor. The method also comprises applying a cation stream to the crystal growth surface of the QCM sensor, wherein the cation stream comprises one or more metallic compounds comprising metal elements selected from Ca, Mg, K, Al, Na, Ti, Fe, Sn, or combinations thereof, where metallic cations of the cation stream attach to the carboxylic acid functional groups on the crystal growth surface. The method also comprises applying an anion stream to the crystal growth surface of the QCM sensor, wherein the anion stream comprises one or more salts, where salts of the anion stream combine with the attached cations to form crystals on the crystal growth surface of the QCM sensor, the crystals forming a crystal layer comprising an average thickness greater than 5 nanometers.

In accordance with one embodiment of the present disclosure, a method of growing crystals on a QCM sensor comprises treating a crystal growth surface of the QCM sensor with a coupling agent comprising carboxylic acid functional groups to bond the carboxylic acid functional groups of the coupling agent to the crystal growth surface of the QCM sensor, applying a cation stream to the crystal growth surface of the QCM sensor, wherein the cation stream comprises one or more metallic compounds comprising metal elements selected from Ca, Mg, K, Al, Na, Ti, Fe, Sn, or combinations thereof, where metallic cations of the cation stream attach to the carboxylic acid functional groups on the crystal growth surface, and applying an anion stream to the crystal growth surface of the QCM sensor, wherein the anion stream comprises one or more salts, where salts of the anion stream combine with the attached cations to form crystals on the crystal growth surface of the QCM sensor, the crystals forming a crystal layer comprising an average thickness greater than 5 nanometers.

In accordance with another embodiment of the present disclosure, a QCM sensor comprising a crystal layer on a crystal growth surface of the QCM sensor, where the crystal layer is formed by a process comprising treating the crystal growth surface of the QCM sensor with a coupling agent comprising carboxylic acid functional groups to bond the carboxylic acid functional groups of the coupling agent to the crystal growth surface of the QCM sensor, applying a cation stream to the crystal growth surface of the QCM sensor, where metallic cations of the cation stream attach to the carboxylic acid functional groups on the crystal growth surface, and applying an anion stream to the crystal growth surface of the QCM sensor, where salts of the anion stream combine with the attached cations to form the crystal layer on the crystal growth surface of the QCM sensor.

Although the concepts of the present disclosure are described herein with primary reference to forming calcium carbonate and calcium magnesium carbonate crystals, it is contemplated that the concepts will enjoy applicability to any type of crystal. For example, and not by way of limitation, it is contemplated that the concepts of the present disclosure will enjoy applicability to silicate crystals and various other types of crystals.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
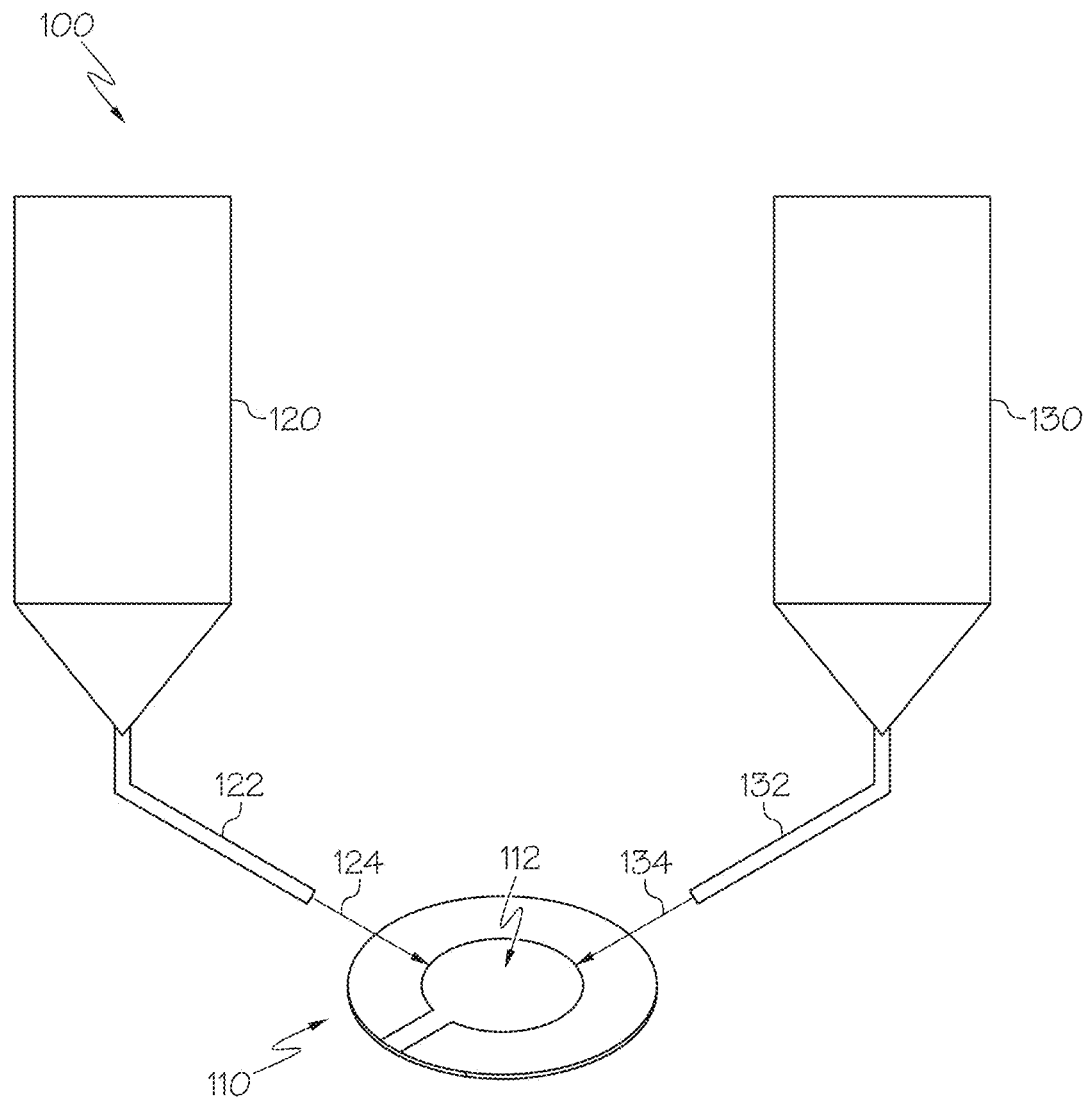
FIG. 1 schematically depicts a system for growing crystals on a QCM sensor in accordance with one or more embodiments of the present disclosure.

Referring initially to FIG. 1, a system 100 for growing crystals on a QCM sensor 110 is shown. The system 100 may generally comprise a QCM sensor 110 with a crystal growth surface 112. The crystal growth surface 112 refers to the portion of the QCM sensor 110 where crystals are grown. The system 100 may further comprise a cation stream source 120 in fluid communication with a cation stream conduit 122. A cation stream 124 may be directed from the cation stream source 120 through the cation stream conduit 122 to the crystal growth surface 112 of the QCM sensor 110. Similarly, the system 100 may further comprise an anion stream source 130 in fluid communication with an anion stream conduit 132. An anion stream 134 may be directed from the anion stream source 130 through the anion stream conduit 132 to the crystal growth surface 112 of the QCM sensor 110.

As used throughout the present disclosure, a QCM sensor 110 refers to a quartz disc that may be sandwiched between a pair of electrodes. The sensor can be excited to oscillate at its resonant frequency by the application of an alternating voltage. The resonant frequency depends on the total oscillating mass of the sensor and sensor surface adhering layers. The frequency decreases when a thin film is attached to the sensor. If the film is thin and rigid, the decrease in frequency is proportional to the mass of the film. In this way, the QCM operates as a very sensitive balance. Unlike QCM sensors, a QCM-D sensor monitors the frequency and energy dissipation response of the freely oscillating sensor, thus generating results that can often be obtained more quickly and can be more accurate.

Still referring to FIG. 1, a method of growing crystals on a QCM sensor 110 may comprise treating a crystal growth surface 112 of the QCM sensor 110 with a coupling agent, applying a cation stream 124 to the crystal growth surface 112 of the QCM sensor 110, and applying an anion stream 134 to the crystal growth surface 112 of the QCM sensor 110. The coupling agent may enhance the affinity between the QCM surface and the layer of crystals.

In one or more embodiments, the coupling agent may comprise carboxylic acid functional groups. Treating the crystal growth surface 112 of the QCM sensor 110 with the coupling agent may bond the carboxylic acid functional groups of the coupling agent to the crystal growth surface 112 of the QCM sensor 110. Treating the crystal growth surface 112 of the QCM sensor 110 with the coupling agent may chemically graft multiple carboxyl (—COOH) groups onto the crystal growth surface 112 via covalent bonding. After treating the crystal growth surface 112 of the QCM sensor 110 with the coupling agent, the crystal growth surface 112 of the QCM sensor 110 may be washed with deionized water. Washing with deionized water may remove any residues that are not bonded to the crystal growth surface 112 that are remaining on the crystal growth surface 112 of the QCM sensor 110.

In some embodiments, the coupling agent may be silane-based. As used in the present disclosure, silane-based may refer to a solution comprising greater than 50 weight percent (wt. %) silane (R—Si(OR')$_3$) moieties. R may comprise (CH$_2$)$_3$—N(CH$_2$COOH)—(CH$_2$)$_2$—N(CH$_2$COOH)$_2$, (CH$_2$)$_3$—COOH, or (CH$_2$)$_3$—OP(CH$_3$)O$_2$H. R' may comprise H, CH$_3$, or CH$_2$CH$_3$. In embodiments, the silane-based coupling agent may comprise greater than 60 wt. % silane moieties, such as greater than 70 wt. %, greater than 80 wt. %, greater than 90 wt. %, greater than 95 wt. %, greater than 97 wt. %, or greater than 99 wt. % silane moieties. In one or more embodiments, the silane-based coupling agent may be a monosodium salt or trisodium salt in water solution, such as a solution of 35 to 45 volume percent (v. %) monosodium salt or trisodium salt in water. For example, in one or more embodiments, the silane-based coupling agent may comprise N-(trimethoxysilylpropyl)ethylenediaminetriacetate, or 3-(trihydroxysilyl)propyl methylphosphonate. In embodiments where the coupling agent is silane-based, the treatment of the crystal growth surface 112 of the QCM sensor 110 with the coupling agent may occur in the presence of ammonium hydroxide (NH$_3$·H$_2$O) or hydrogen chloride (HCl) as a catalyst in a water-ethanol mixed solvent at approximately room temperature for approximately twelve hours. A silane-based coupling agent may be preferred when the crystal growth surface 112 of the QCM sensor 110 comprises silica or silicon. The treatment of the QCM sensor 110 with a silane-based coupling agent may result in the following hydrolysis reaction on the crystal growth surface 112:

≡Si—OH+(OC$_2$H$_5$)$_3$Si—(CH$_2$)$_3$—N(CH$_2$COOH)—(CH$_2$)$_2$N(CH$_2$COOH)$_2$→≡Si—(CH$_2$)$_3$—N(CH$_2$COOH)—(CH$_2$)$_2$—N(CH$_2$COOH)$_2$

In other embodiments, the coupling agent may be thiol-based. As used in the present disclosure, thiol-based may refer to a solution comprising greater than 50 wt. % thiol (R—SH) moieties, where R may comprise (CH$_2$)$_2$—COOH, (CH$_2$)$_5$—COOH, (CH$_2$)$_7$—COOH, (CH$_2$)$_{11}$—COOH, CH$_2$CH(NH$_2$)COOH or (CH$_2$)$_{11}$—OPO$_3$H$_2$. In embodiments, the thiol-based coupling agent may comprise greater than 60 wt. % thiol moieties, such as greater than 70 wt. %, greater than 80 wt. %, greater than 90 wt. %, greater than 95 wt. %, greater than 97 wt. %, or greater than 99 wt. % thiol moieties. For example, in one or more embodiments, the thiol-based coupling agent may comprise thioglycolic acid, 3-Mercaptopropionic acid, 6-Mercaptohexanoic acid, cysteine, or combinations of these. In embodiments where the coupling agent is thiol-based, the functionalization of the crystal growth surface 112 of the QCM sensor 110 with the coupling agent may occur by flowing treatment agent over the QCM sensor 110, which is a solution of both thiol groups and carboxylate groups at approximately room temperature for approximately twelve hours. A thiol-based coupling agent may be preferred when the crystal growth surface 112 of the QCM sensor 110 comprises gold. The treatment of the QCM sensor 110 with a thiol-based coupling agent may result in the following reaction on the crystal growth surface 112:

≡Au+HS—(CH$_2$)$_n$—COOH→((CH$_2$)$_n$—COOH)

Still referring to FIG. 1, the cation stream 124 may comprise one or more metallic compounds. As used in the present disclosure, a metallic compound may refer to a metal element or a compound that contains one or more metal elements bonded to another element. Typically, the metal atom acts as the cation in the compound and is bonded to a nonmetallic anion or an ionic group. In embodiments, the metallic compounds may comprise metal elements selected from Ca, Mg, K, Al, Na, Ti, Fe, Sn, or combinations thereof. The metallic cations of the cation stream 124 may attach to the carboxylic acid functional groups on the crystal growth surface 112. As previously described, the carboxylic acid functional groups may be on the crystal growth surface 112 from treatment of the crystal growth surface 112 with the coupling agent.

In one or more embodiments, the one or more metallic compounds of the cation stream 124 may be present in their elemental form, as a metal nitrate, as a metal chloride, or as a metal sulfate. In embodiments, the cation stream 124 may comprise calcium chloride. In some embodiments, the cation stream 124 may further comprise magnesium chloride, such that the cation stream 124 comprises a combination of calcium chloride and magnesium chloride.

In one or more embodiments, the anion stream 134 may comprise one or more salts. The salts of the anion stream 134 may combine with the attached cations to form crystals on the crystal growth surface 112 of the QCM sensor 110. That is, the salts of the anion stream 134 may attach to the cations on the crystal growth surface 112 of the QCM sensor 110. In embodiments, the attachment between the salts of the anion stream 134 and the cations of the cation stream 124 may be a chemical bond, such as an ionic bond. The crystals forming a crystal layer may comprise an average thickness greater than 5 nanometers. Average thickness refers to the average of the thickness of the crystal layer as measured across the entire crystal growth surface 112 of the QCM sensor 110.

The one or more salts of the anion stream 134 may comprise carbonates, silicates, aluminates, phosphates, or mixtures of these. In embodiments, the anion stream 134 may comprise sodium carbonate.

In one or more embodiments, the method may further comprise washing the QCM sensor 110 with a cleaning agent. The QCM sensor 110 may be washed with the cleaning agent prior to treating the crystal growth surface 112 of the QCM sensor 110 with the coupling agent, as previously described. The cleaning agent may remove organic residues from the crystal growth surface 112 of the QCM sensor 110. The cleaning agent may also hydroxylate the crystal growth surface 112 of the QCM sensor 110 with hydroxyl (—OH) groups.

In some embodiments, the cleaning agent may comprise sulfuric acid. A cleaning agent comprising sulfuric acid may be preferable with a QCM sensor 110 having a silica or silicon crystal growth surface 112. The cleaning agent may comprise approximately 75 v. % sulfuric acid and approximately 25 v. % of a 30% hydrogen peroxide solution. The 75 v. % sulfuric acid and approximately 25 v. % of a 30% hydrogen peroxide solution may be referred to as Piranha solution or Piranha etch.

In other embodiments, the cleaning agent may comprise nitric acid. A cleaning agent comprising nitric acid may be preferable with a QCM sensor 110 having a gold crystal growth surface 112. Depending on the material of the crystal growth surface 112 of the QCM sensor 110, other cleaning agents may be used.

In one or more embodiments, the cleaning agent may further comprise ethanol, acetone, or chloroform. The ethanol, acetone, or chloroform may remove organic residues or contaminants which may have been absorbed to the crystal growth surface 112 of the QCM sensor 110 during exposure to the external environment.

The application of the cation stream 124 and the anion stream 134 will now be described in greater detail. As previously described, the application of the cation stream 124 and the anion stream 134 may form crystals on the crystal growth surface 112 of the QCM sensor 110. In some embodiments, the application of the cation stream 124 and the anion stream 134 to the crystal growth surface 112 of the QCM sensor 110 may be simultaneous. The process may continue in multiple iterations to form crystals on the crystal growth surface 112 of the QCM sensor 110.

In other embodiments, the application of the cation stream 124 and the anion stream 134 to the crystal growth surface 112 of the QCM sensor 110 may be a substantially exclusive sequence where there is no substantial overlap in the application of components of the cation stream 124 with application of components of the anion stream 134 to the crystal growth surface 112 of the QCM sensor 110. That is, in some embodiments, the cation stream 124 may be applied, then prior to applying the anion stream 134, the application of the cation stream 124 may be halted, such that the application of the cation stream 124 and the anion stream 134 is in alternation. The process may continue in multiple iterations to form crystals on the crystal growth surface 112 of the QCM sensor 110.

In other embodiments, the application of the cation stream 124 and the anion stream 134 to the crystal growth surface 112 of the QCM sensor 110 may be an overlapping sequence where overlapping volumetric portions of the cation stream 124 and the anion stream 134 are simultaneously applied to the crystal growth surface 112 of the QCM sensor 110. In embodiments where the application of the cation stream 124 and the anion stream 134 to the crystal growth surface 112 of the QCM sensor 110 may be an overlapping sequence, the overlapping volumetric portions of the cation stream 124 and anion stream 134 are less than 2 v. % of a combined total volume of the cation stream 124 and the anion stream 134. The process may continue in multiple iterations to form crystals on the crystal growth surface 112 of the QCM sensor 110.

Through varying the application of the cation stream 124 and the anion stream 134 during formation of the crystals on the crystal growth surface 112 of the QCM sensor 110, the roughness of the crystals may be controlled at the micro/nano scale by tuning the size of the crystals. After applying the cation stream 124 and the anion stream 134, the QCM sensor 110 may be washed again with deionized water and dried. For example, the QCM sensor 110 may be dried at approximately 100 degrees Celsius (° C.) for approximately two hours. To confirm the crystal formation, roman spectroscopy and SEM imaging may be utilized.

The application of the cation stream 124, where the cation stream 124 comprises calcium chloride, is shown in the following reaction:

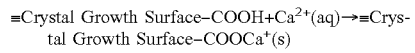

Further, the application of the anion stream 134, where the anion stream 134 comprises sodium carbonate, is shown in the following reaction

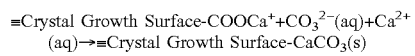

Figure 2:
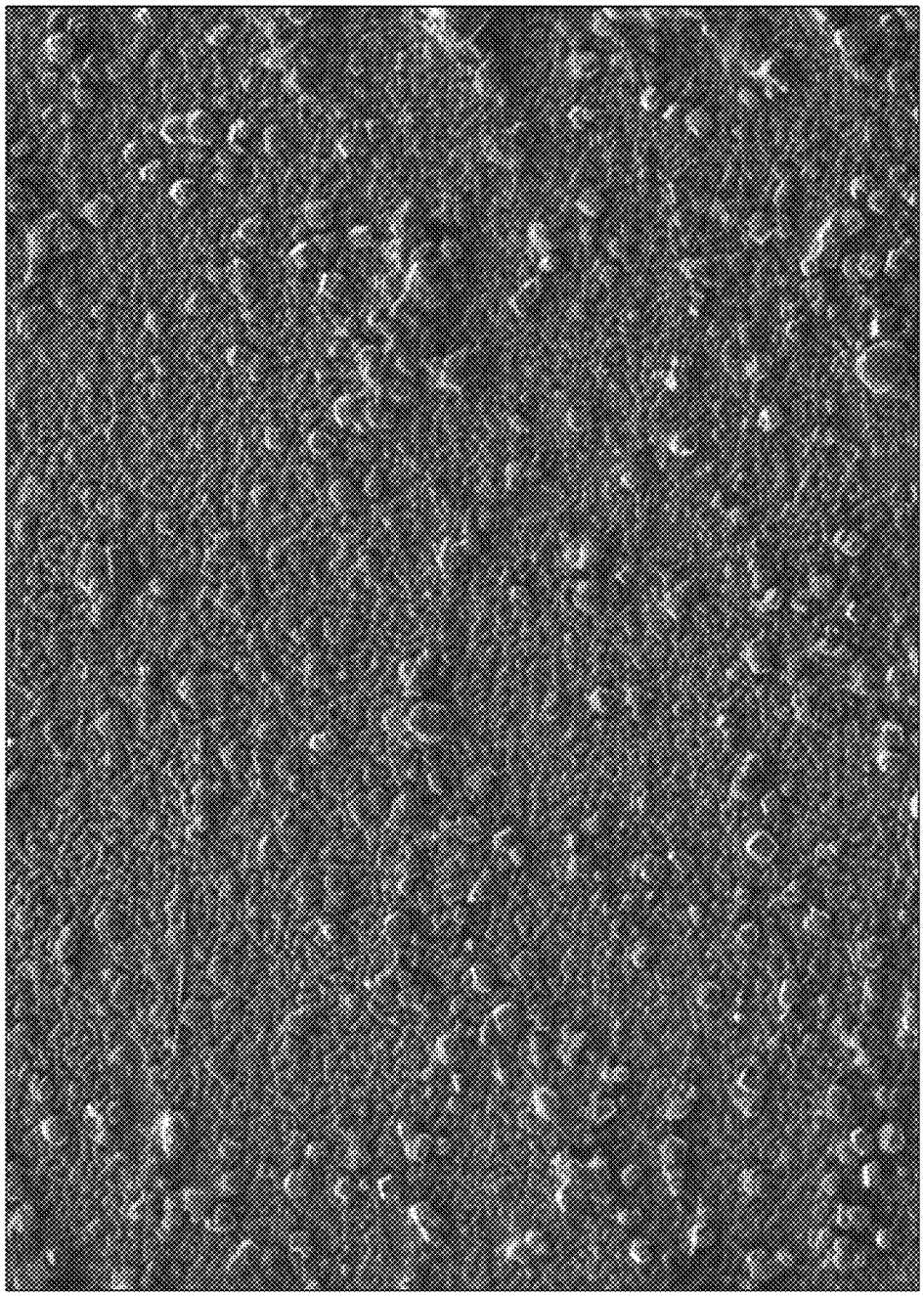
FIG. 2 is a scanning electron microscope (SEM) image of a QCM sensor with crystals on the surface in accordance with one or more embodiments of the present disclosure.

The in-situ process for forming crystals on the QCM sensor 110 may be monitored by quartz crystal microbalance with dissipation (QCM-D). By measuring frequency and dissipation change, the crystals may be tailored to form a surface roughness similar to the formulation surface present in the environment that is desired to be studied. Scanning Electron Microscopy (SEM) may also be used to verify the surface roughness of the crystals formed on the QCM sensor 110. Referring to FIG. 2, a SEM crystal image 200 depicts calcium carbonate crystals formed on a QCM sensor 110.

Again referring to FIG. 1, the crystals formed on the crystal growth surface 112 of the QCM sensor 110 will now be described in greater detail. In some embodiments, the crystals may comprise calcium carbonate crystals to mimic limestone. In embodiments where the crystals comprise calcium carbonate crystals, the cation stream 124 may comprise calcium chloride and the anion stream 134 may comprise sodium carbonate. However, in embodiments where the crystals comprise calcium carbonate crystals, other forms of calcium in the cation stream 124 and carbonate in the anion stream 134 may be used. As an example, the cation stream 124 may comprise, but is not limited to, calcium sulfate or calcium silicate. Similarly, for example, the anion stream 134 may comprise, but is not limited to, magnesium carbonate or potassium carbonate.

In other embodiments, the crystals may comprise calcium magnesium carbonate crystals to mimic dolomite. In embodiments where the crystals comprise calcium magnesium carbonate crystals, the cation stream 124 may comprise calcium chloride and magnesium chloride and the anion stream 134 may comprise sodium carbonate. The stoichiometric ratio of the calcium chloride and magnesium chloride in the cation stream 124 may be varied depending on the formulation being studied. However, in embodiments where the crystals comprise calcium magnesium carbonate crystals, other forms of calcium and magnesium in the cation stream 124 and carbonate in the anion stream 134 may be used, as previously discussed with respect to embodiments where the crystals comprise calcium carbonate crystals.

In some embodiments, the crystals may be micro-sized. As used in the present disclosure, micro-sized crystals may refer to crystals that have a crystal size from 1 micrometer to 999 micrometers. Crystal size may be measured using a variety of conventional or yet to be developed measurement techniques. For example, the crystals may be sieved using mesh screens with varying sizes. In measuring the crystals, the crystals will not pass through a mesh screen with openings that are smaller than the crystal size, but will pass through a mesh screen with openings that are larger than the crystal size. By determining which mesh screens the crystals will not pass through and which mesh screens the crystals will pass through, crystal size may be determined. In other embodiments, the crystals may be nano-sized. As used in the present disclosure, micro-sized crystals may refer to crystals that have a crystal size from 1 nanometer to 999 nanometer.

In embodiments, the crystal layer may comprise a surface roughness, $R_a$, greater than or equal to 0.025 µm. As previously discussed, the average thickness of the crystal layer may range from several nanometers to tens of micrometers. For example, in embodiments, the average thickness of the crystal layer may be greater than 1 micrometers, greater than 2 micrometers, greater than 3 micrometers, greater than 4 micrometers, greater than 5 micrometers, greater than 10 micrometers, greater than 15 micrometers, or greater than 20 micrometers.

According to one or more embodiments, the QCM sensor 110 comprises a crystal layer on the crystal growth surface 112 of the QCM sensor 110, where the crystal layer is formed according to the processes previously described in the present disclosure. That is, the crystal layer may be formed by treating the crystal growth surface 112 of the QCM sensor 110 with a coupling agent comprising carboxylic acid functional groups to bond the carboxylic acid functional groups of the coupling agent to the crystal growth surface 112 of the QCM sensor 110, by applying a cation stream 124 to the crystal growth surface 112 of the QCM sensor 110, where metallic cations of the cation stream 124 attach to the carboxylic acid functional groups on the crystal growth surface 112, and by applying an anion stream 134 to the crystal growth surface 112 of the QCM sensor 110, where salts of the anion stream 134 combine with the attached cations to form the crystal layer on the crystal growth surface 112 of the QCM sensor 110.

While QCM sensors comprising a crystal layer and processes for forming calcium carbonate crystals and calcium magnesium carbonate crystals have been described in the present disclosure, the crystals may comprise a variety of other crystals. For example, the crystals may comprise, but are not limited to, silicate crystals ($KAlSi_3O_8$, $NaAlSi_3O_8$, $CaAl_2Si_2O_8$), anstase/rutile crystals ($TiO_2$), magnetite/maghemite/hematite crystals ($Fe_3O_4$), $SnO_2$, $Al_2O_3$/$CaAl_2O_4$/$Ca_3Al_2O_6$, or zeolite crystals. One skilled in the art will appreciate the applicability of the systems and methods described in the present disclosure to various other crystals. Specifically, one skilled in the art will recognize that the cation stream 124 and anion stream 134 may be tailored for the desired crystals to be formed on the crystal growth surface 112 of the QCM sensor 110. Depending on the formulation to be studied, another crystal may be necessary.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Further, it will be apparent that modifications and variations are possible without departing from the scope of the present disclosure, including, but not limited to, embodiments defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method of growing crystals on a quartz crystal microbalance with dissipation (QCM-D) sensor to model a limestone or dolomite formulation surface present in an environment to be studied, the method comprising:

treating a crystal growth surface of the QCM-D sensor in the presence of a solution comprising water, ethanol, and ammonium hydroxide with a silane-based coupling agent comprising carboxylic acid functional groups to bond the carboxylic acid functional groups of the silane-based coupling agent to the crystal growth surface of the QCM-D sensor, wherein the silane-based coupling agent comprises N-(trimethoxysilylpropyl) ethylenediaminetriacetate;

applying a cation stream to the crystal growth surface of the QCM-D sensor, wherein the cation stream comprises one or more metallic compounds comprising metal elements selected from Ca, Mg, or both, where metallic cations of the cation stream attach to the carboxylic acid functional groups on the crystal growth surface;

applying an anion stream to the crystal growth surface of the QCM-D sensor, wherein the anion stream comprises one or more salts comprising carbonates, where salts of the anion stream combine with the attached cations to form crystals on the crystal growth surface of the QCM-D sensor, the crystals forming a crystal layer comprising an average thickness greater than 5 nanometers, wherein the cation stream and the anion stream are applied in alternation in multiple iterations and the application of the cation stream and the anion stream to the crystal growth surface of the QCM-D sensor is a substantially exclusive sequence where there is no substantial overlap in the application of components of the cation stream with application of components of the anion stream to the crystal growth surface of the QCM-D sensor; and measuring frequency and dissipation changes of the crystal layer during the application of the cation stream and the anion stream using the QCM-D sensor to tailor the surface roughness of the crystal layer similar to the limestone or dolomite formulation surface, wherein the surface roughness, $R_a$, of the crystal layer is greater than or equal to 0.025 µm.

2. The method of claim 1, wherein the method further comprises washing the QCM-D sensor with a cleaning agent.

3. The method of claim 2, wherein the cleaning agent comprises sulfuric acid or nitric acid.

4. The method of claim 3, wherein the cleaning agent comprises approximately 75 v. % sulfuric acid and approximately 25 v. % of a 30% hydrogen peroxide solution.

5. The method of claim 1, wherein the one or more metallic compounds of the cation stream are present in their elemental form, as a metal nitrate, as a metal chloride, or as a metal sulfate.

6. The method of claim 1, wherein the one or more salts further comprise silicates, aluminates, phosphates, or mixtures thereof.

7. The method of claim 1, wherein the cation stream comprises calcium chloride and the anion stream comprises sodium carbonate.

8. The method of claim 7, wherein the cation stream further comprises magnesium chloride.

9. The method of claim 1, wherein the crystals comprise calcium carbonate crystals, calcium magnesium carbonate crystals, or both.

10. The method of claim 1, wherein the one or more metallic compounds further comprise metal elements selected from K, Al, Na, Ti, Fe, Sn, or combinations thereof.

11. A method of growing crystals on a quartz crystal microbalance with dissipation (QCM-D) sensor to model a limestone or dolomite formulation surface present in an environment to be studied, the method comprising:

treating a crystal growth surface of the QCM-D sensor in the presence of a solution comprising water, ethanol, and ammonium hydroxide with a silane-based coupling agent comprising carboxylic acid functional groups to bond the carboxylic acid functional groups of the silane-based coupling agent to the crystal growth surface of the QCM-D sensor, wherein the silane-based coupling agent comprises N-(trimethoxysilylpropyl) ethylenediaminetriacetate;

applying a cation stream to the crystal growth surface of the QCM-D sensor, wherein the cation stream comprises one or more metallic compounds comprising metal elements selected from Ca, Mg, or both, where metallic cations of the cation stream attach to the carboxylic acid functional groups on the crystal growth surface;

applying an anion stream to the crystal growth surface of the QCM-D sensor, wherein the anion stream comprises one or more salts comprising carbonates, where salts of the anion stream combine with the attached cations to form crystals on the crystal growth surface of the QCM-D sensor, the crystals forming a crystal layer comprising an average thickness greater than 5 nanometers, wherein:

the cation stream comprises calcium chloride, magnesium chloride, or mixtures of these and the anion stream comprises sodium carbonate, the cation stream and the anion stream are applied in alternation in multiple iterations, the application of the cation stream and the anion stream to the crystal growth surface of the QCM-D sensor is a substantially exclusive sequence where there is no substantial overlap in the application of components of the cation stream with application of components of the anion stream to the crystal growth surface of the QCM-D sensor, the crystal layer comprises a surface roughness $R_a$, greater than or equal to 0.025 µm, and the average thickness of the crystal layer is greater than 5 micrometers; and measuring frequency and dissipation changes of the crystal layer during the application of the cation stream and the anion stream using the QCM-D sensor to tailor the surface roughness of the crystal layer similar to the limestone or dolomite formulation surface.

12. The method of claim 11, wherein the one or more metallic compounds further comprise metal elements selected from K, Al, Na, Ti, Fe, Sn, or combinations thereof.

* * * * *